United States Patent [19]

Yeh et al.

[11] Patent Number: 5,614,270

[45] Date of Patent: Mar. 25, 1997

[54] METHOD OF IMPROVING ELECTRICAL CHARACTERISTICS OF A LIQUID PHASE DEPOSITED SILICON DIOXIDE FILM BY PLASMA TREATMENT

[75] Inventors: Ching-Fa Yeh; Shyue S. Lin, both of Hsinchu, Taiwan

[73] Assignee: National Science Council, Taipei, Taiwan

[21] Appl. No.: 598,961

[22] Filed: Feb. 9, 1996

[51] Int. Cl.⁶ ..................................................... H05H 1/00
[52] U.S. Cl. ........................ 427/539; 427/535; 427/569; 427/574; 427/579
[58] Field of Search .................................... 427/535, 539, 427/574, 579, 569

[56] References Cited

U.S. PATENT DOCUMENTS 4,468,420  8/1984  Kawahara et al. .................. 427/397.7

OTHER PUBLICATIONS

Ching–Fa Yeh, et al. "Performance and Off–State Current Mechanisms of Low–Temperature Processed Polysilicon Thin Film Transistors with Liquid Phase Deposited $SiO_2$ Gate Insulator," *IEEE Trans. On Electron Devices*, vol. 41, pp. 173–179, 1994. (No Month Avail.).

S. Yoshitomi, et al., "The Characteristics of Si MOS Diodes Using the $SiO_2$ Films Prepared by the Liquid Phase Deposition," *International. EDMS*, pp. 22–25, 1992. (No Month Avail.).

*Primary Examiner*—Bernard Pianalto
*Attorney, Agent, or Firm*—Hitt Chwang & Gaines, P.C.

[57] ABSTRACT

A silicon dioxide layer grown by liquid phase deposition is, subjected to an oxygen or hydrogen plasma treatment to enhance the physical and electrical properties thereof. The plasma treatment is carried out at a temperature of about 300° C.

4 Claims, 1 Drawing Sheet

METHOD OF IMPROVING ELECTRICAL CHARACTERISTICS OF A LIQUID PHASE DEPOSITED SILICON DIOXIDE FILM BY PLASMA TREATMENT

FIELD OF THE INVENTION

The present invention relates to a method of improving the properties of a liquid phase deposited silicon dioxide layer, and in particular to a method of improving the dielectric properties of a liquid phase deposited silicon dioxide layer.

BACKGROUND OF THE INVENTION $SiO_2$ layer grown by liquid phase deposition (LPD) at room temperature not only has a low residual stress but also is advantageous in the fabrication of various semiconductor devices which requires a low fabrication temperature, such as the fabrication of LCD and 3-dimensional IC devices.

In U.S. Pat. No. 4,468,420, H. Kawahara et al. first disclose a method for making a silicon dioxide coating which comprises dipping a substrate in a mixed solution obtained by adding boric acid to an aqueous silicon dioxide-saturated solution of hydrofluosilicic acid. One of the present inventors, Ching-Fa Yeh, and his co-workers, in their article, entitled "Performance and Off-State Current Mechanisms of Low-Temperature Processed Polysilicon Thin Film Transistors with Liquid Phase Deposited $SiO_2$ Gate Insulator", C.F. Yeh, S.S. Lin, T.Z. Yang, C.L. Chen and Y.C. Yang, IEEE Trans. on Electron Devices, Vol. 41, pp. 173–179, 1994, have successfully used a $SiO_2$ grown by this liquid phase deposition (LPD) technique as a gate dielectric in a poly-Si thin film transistor which shows satisfactory electrical characteristics. However, the breakdown field strength of the LPD-$SiO_2$ film is about 7–8 MV/cm and the interface trap density at the LPD-$SiO_2$/Si interface is about $5\times10^{11}$ $eV^{-1}cm^{-2}$, which still can be improved in comparison with a thermal $SiO_2$ film.

S. Yoshitomi, S. Tomlika and N. Honeji in their article, entitled "The Characteristics of Si MOS Diodes Using the $SiO_2$ Films Prepared by the Liquid Phase Deposition", International. EDMS, pp. 22–25, 1992, disclose a thermal annealing process to enhance the properties of the $SiO_2$ films grown by the liquid phase deposition, in which annealing in $O_2$ at a temperature of 400° C. is found to be effective to improve the characteristics of the LPD-$SiO_2$ film.

SUMMARY OF THE INVENTION

The primary objective of the present invention is to provide a low temperature method to enhance the dielectric characteristics of the LPD-$SiO_2$ film without losing the merit of low-temperature process of LPD.

In order to accomplish the aforesaid objective, a method of improving the properties of liquid phase deposited $SiO_2$ film provided according to the present invention comprises subjecting a liquid phase deposited $SiO_2$ film to an oxygen or hydrogen plasma treatment, preferably an oxygen plasma treatment.

Preferably, the oxygen and hydrogen plasma treatments are carried out at a pressure of 0.1–0.25 torr and a temperature of room temperature to 450° C.

Preferably, the plasma treatment is carried out with a power density of 0.56–0.85 $W/cm^2$ for a period of 1–3 hours.

The present method can effectively improve the breakdown field strength and interface trap density of LPD $SiO_2$ film without losing the merit of low-temperature process of LPD.

DETAILED DESCRIPTION OF THE INVENTION

Figure 1:
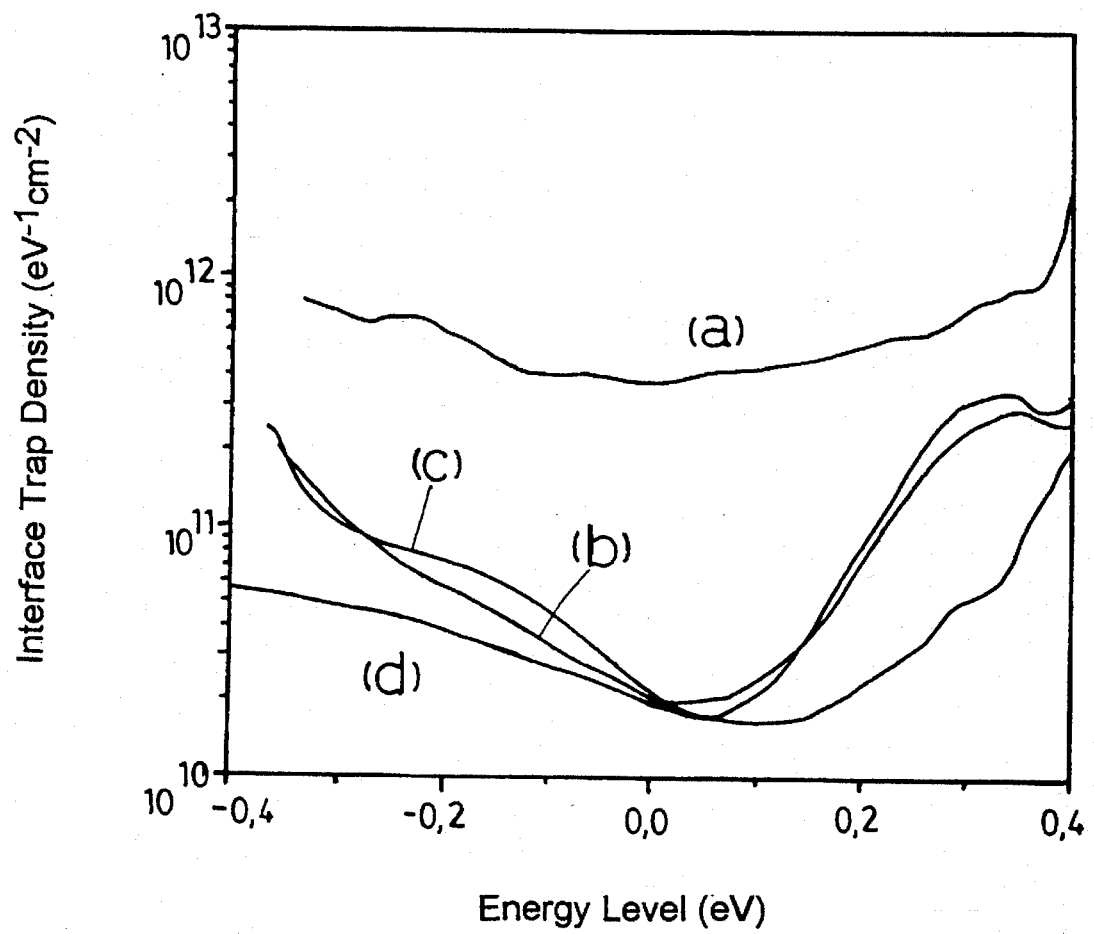
FIG. 1 is a plot which shows the distribution of interface trap densities at LPD $SiO_2$/Si interface of MOS diodes, wherein curve (a) represents the MOS diode containing a LPD $SiO_2$ film without any treatment; (b) represents the MOS diode containing a LPD $SiO_2$ film subjected to an $O_2$ thermal annealing treatment at 600° C.; (c) represents the MOS diode containing a LPD-$SiO_2$ film subjected to a $H_2/N_2$ plasma treatment at 300° C.; and (d) represents the MOS diode containing a LPD-$SiO_2$ film subjected to an $O_2$ plasma treatment at 300° C.

The present invention discloses a method of improving the characteristics of an liquid phase deposited $SiO_2$ (LPD-$SiO_2$) film by an annealing treatment, which comprises subjecting the LPD-$SiO_2$ film to an $O_2$ or $H_2/N_2$ plasma treatment. In one of the preferred embodiments of the present invention, the breakdown field strength of an LPD-$SiO_2$ film increases from 8.3 MV/cm to 9.8 MV/cm and the interface trap density thereof reduces from $5\times10^{11}$ $eV^{-1}cm^{-2}$ to $2\times10^{10}$ $eV^{-1}cm^{-2}$ after being treated by the present method. The breakdown field strength and the interface trap density of an LPD-$SiO_2$ film before or after the treatment were measured on a MOS diode which was fabricated without post-metal anneal.

The invention will be further illustrated by the following examples. The following examples are only meant to illustrate the invention, but not to limit it.

EXAMPLES 1–2

35 g of silica powder having a purity of 99.99% was added to 1 liter of 4M hydrofluosilicic acid ($H_2SiF_6$) to obtain a silica-saturated $H_2SiF_6$ solution. Furthermore, to supersaturate the resulting silica-saturated $H_2SiF_6$ solution with $SiO_2$, 2.63 ml of water and 13.5 ml of 0.1M boric acid were added to 50 ml of the resulting silica-saturated $H_2SiF_6$ solution.

A silicon substrate cleaned by standard procedures was immersed in the $SiO_2$-supersaturated $H_2SiF_6$ solution at a temperature of 30° C. for one hour. On the surfaces of the silicon substrate $SiO_2$ films having a thickness of about 1500 Å were formed.

The silicon substrate was then placed in a parallel plate plasma reactor to undergo hydrogen and oxygen plasma treatments respectively according to the conditions listed as follows:

| | |
|---|---|
| Ex. 1. Hydrogen plasma | $H_2/N_2$: 60 sccm/60 sccm, 0.25 torr |
| Ex. 2. Oxygen plasma | $O_2$: 150 sccm, 0.25 torr |
| Frequency | 13.56 MHz |
| Temperature | 300° C. |
| Power density | 0.7 $W/cm^2$ |
| Time | 1 hour |

On the surface of one of the plasma-treated $SiO_2$ films located at the upper side of the silicon substrate an aluminum layer was formed by thermal evaporation. Aluminum electrodes of various areas were then formed by lithography.

Prior to removing the $SiO_2$ film located at the bottom side of the silicon substrate by etching, a protective photo-resist layer was formed on the aluminum electrodes. A bottom electrode layer was then formed by depositing an aluminum layer on the bottom surface of the silicon substrate. AMOS diode was obtained after the protective photo-resist layer was stripped.

Control Example 1:

The procedures of Example 2 were repeated except that the $O_2$ plasma treatment was not used.

Control Example 2:

The procedures of Example 2 were repeated except that the $O_2$ plasma treatment was replaced by an $O_2$ thermal annealing treatment which was carried out at 600° C. in accordance with the method disclosed by S. Yoshitomi, S. Tomilka and N. Honeji, International. EDMS, PP. 22–25, 1992.

The $SiO_2$ films were characterized by their refractive indexes and etching rates wherein the former were measured by using an ellipsometer and the latter was measured at room temperature by using a P-etch solution of 48% HF:70% $HNO_3$:$H_2O$=3:2:60. The results are shown in Table 1.

TABLE 1

| LPD-$SiO_2$ film | | Refractive index, n | P-etch rate, Å/sec |
| --- | --- | --- | --- |
| Control Ex. 1 | without treatment | 1.43 | 20 |
| Control Ex. 2 | $O_2$ thermal annealing (600° C.) | 1.432 | 7.6 |
| Ex. 1 | $H_2$/$N_2$ plasma (300° C.) | 1.45 | 9.2 |
| Ex. 2 | $O_2$ plasma (300° C.) | 1.456 | 7.5 |

The data in Table 1 show that the refractive indexes of the LPD-$SiO_2$ films modified by the present method (Examples 1 and 2) are increased from the original refractive index of 1.43 (Control Example 1) to values which are very close to that of a thermal $SiO_2$ film (1.46). The P-etch rate of the originally formed LPD-$SiO_2$ film is 20 Å/sec (Control Example 1) which is remarkably reduced to 9.2 and 7.5 Å/sec after being subjected to hydrogen plasma treatment (Example 1 ) and oxygen plasma treatment (Example 2), respectively. We believe that the hydrogen and oxygen plasma treatments can render the LPD-$SiO_2$ film much denser (less porous), which results in a higher refractive index and a lower P-etch rate.

Table 2 shows the distribution of breakdown electric field strength ($E_{BD}$) of MOS diodes fabricated in the Examples 1–2 and Control Examples 1–2. It can be seen from Table 2 that the LPD-$SiO_2$ films treated by hydrogen and oxygen plasma (Examples 1 and 2) have a better performance than the thermal annealed LPD-$SiO_2$ film (Control Example 2) in terms of the distribution of breakdown electric field strength of MOS diode. In particular, the LPD-$SiO_2$ film treated by oxygen plasma (Example 2) has the maximum $E_{BD}$ (10 MV/cm) and a failure percentage which is not higher than 10% until 9 MV/cm electric field strength. This may be due to the more denser (less porous) structure of the plasma treated LPD-$SiO_2$ film.

TABLE 2

| | Failure, % | | | |
| --- | --- | --- | --- | --- |
| $E_{BD}$, MV/cm | Control Ex. 1 (untreated) | Control Ex. 2 (thermal annealed) | Ex. 1 ($H_2$/$N_2$ plasma treated) | Ex. 2 ($O_2$ plasma treated) |
| 1 | 10 | 5 | 5 | 3 |
| 2 | 3 | 3 | 3 | — |
| 3 | — | — | 3 | — |
| 4 | — | 3 | — | — |
| 6 | 3 | — | — | — |
| 7 | 5 | — | — | — |
| 8 | 35 | 15 | 2 | 2 |
| 9 | 44 | 66 | 25 | 5 |
| 10 | — | 8 | 62 | 79 |
| 11 | — | — | — | 11 |

The Terman method [E. H. Nicollian and J. R. Brews, MOS (Metal Oxide Semiconductor) Physics and Technology. New York: Wiley, P. 325, 1982] was used to calculate a typical distribution of interface trap density for MOS diodes fabricated in the Examples 1–2 and Control Examples 1–2, and the results are shown in FIG. 1. It can be seen from FIG. 1 that, at energy level of 0 eV, the interface trap density at LPD-$SiO_2$/Si interface is reduced from $5 \times 10^{11}$ eV$^{-1}$cm$^{-2}$ [Curve (a)] to about $2 \times 10^{10}$ eV$^{-1}$cm$^{-2}$ after the LPD-$SiO_2$ film being subjected to the hydrogen plasma [Curve (C)] and the oxygen plasma treatment [Curve (D)]. It is believed that the significant reduction of interface trap density by hydrogen and oxygen plasma treatments is because that hydrogen and oxygen diffuse to the interface of LPD-$SiO_2$/Si with the assistance of plasma, and thus diminish the interface defects.

The embodiments of the present invention described above are to be regarded in all respects as being merely illustrative and not restrictive. Accordingly, the present invention may be embodied in other specific forms without deviating from the spirit thereof. The present invention is therefore to be limited only by the scopes of the following appended claims.

What is claimed is:

1. A method of improving electrical characteristics of a liquid phase deposited silicon dioxide film comprising forming a liquid phase deposited silicon dioxide film on a substrate and subjecting the liquid phase deposited silicon dioxide film to an oxygen or hydrogen plasma treatment.

2. The method according to claim 1, wherein the liquid phase deposited silicon dioxide film is subjected to an oxygen plasma treatment.

3. The method according to claim 1, wherein the plasma treatment is carried out at a pressure of 0.1–0.25 torr and a temperature of about 300° C.

4. The method according to claim 1, wherein the plasma treatment is carried out with a power density of 0.56–0.85 W/cm$^2$ for a period of 1–3 hours.

* * * * *

UNITED STATES PATENT AND TRADEMARK OFFICE
CERTIFICATE OF CORRECTION

PATENT NO. : 5,614,270
DATED : March 25, 1997
INVENTOR(S) : Yeh et al.

It is certified that error appears in the above-indentified patent and that said Letters Patent is hereby corrected as shown below:

Col. 1, line 41, delete "Tomlika" and insert therefor -- Tomilka --.

Col.3, line 30, in TABLE 1, insert in the first column, the heading -- Sample --.

Signed and Sealed this

Nineteenth Day of August, 1997

*Attest:*

BRUCE LEHMAN

*Attesting Officer*  *Commissioner of Patents and Trademarks*